(12) United States Patent
Kojovic et al.

(10) Patent No.: US 7,973,536 B2
(45) Date of Patent: Jul. 5, 2011

(54) TRAVELING WAVE BASED RELAY PROTECTION

(75) Inventors: Ljubomir A. Kojovic, Racine, WI (US); Jules Esztergalyos, Vancouver, WA (US)

(73) Assignee: Cooper Technologies Company, Houston, TX (US)

( * ) Notice: Subject to any disclaimer, the term of this patent is extended or adjusted under 35 U.S.C. 154(b) by 0 days.

(21) Appl. No.: 12/403,651

(22) Filed: Mar. 13, 2009

(65) Prior Publication Data

US 2009/0230974 A1   Sep. 17, 2009

Related U.S. Application Data

(62) Division of application No. 10/891,449, filed on Jul. 15, 2004, now Pat. No. 7,535,233.

(51) Int. Cl.
*G01R 31/08* (2006.01)
*G01R 31/00* (2006.01)

(52) U.S. Cl. ........ 324/512; 324/509; 324/522; 324/534; 361/42; 361/80; 702/59

(58) Field of Classification Search .......... 324/509, 324/512, 522, 534, 535; 702/59
See application file for complete search history.

(56) References Cited

U.S. PATENT DOCUMENTS

| | | |
|---|---|---|
| 4,063,166 A | 12/1977 | Glavitsch et al. |
| 4,446,420 A | 5/1984 | Dronet |
| 4,499,417 A | 2/1985 | Wright et al. |
| 4,570,231 A | 2/1986 | Bunch |
| 4,766,549 A | 8/1988 | Schweitzer et al. |
| 5,434,509 A | 7/1995 | Blades |
| 5,608,327 A | 3/1997 | Jones et al. |
| 5,726,574 A * | 3/1998 | Silverberg et al. ............ 324/529 |
| 5,825,189 A | 10/1998 | Johns |
| 5,903,155 A | 5/1999 | Björklund |
| 6,597,180 B1 | 7/2003 | Takaoka et al. |
| 6,822,457 B2 | 11/2004 | Borchert et al. |
| 6,914,762 B2 * | 7/2005 | Bo ................................ 361/62 |
| 2002/0125877 A1 | 9/2002 | Cooke |
| 2003/0112569 A1 | 6/2003 | Kato et al. |

(Continued)

FOREIGN PATENT DOCUMENTS

EP    0 062 446    10/1982

OTHER PUBLICATIONS

PCT International Search Report (PCT/US05/24686) mailed May 12, 2006 (2 pages).

(Continued)

*Primary Examiner* — Timothy J Dole
*Assistant Examiner* — John Zhu
(74) *Attorney, Agent, or Firm* — Fish & Richardson P.C.

(57) ABSTRACT

An apparatus includes at least one Rogowski coil and a processor. The at least one Rogowski coil is positioned within an electrical power distribution network to detect a first traveling wave current caused by a fault on an electrical power transmission line of the network, generate a first signal indicative of detection of the first traveling wave, detect a second traveling wave current caused by the fault on the transmission line, and generate a second signal indicative of detection of the second traveling wave. The processor is adapted to receive the first signal and the second signal and to determine, based on the first signal and the second signal, where on the transmission line the fault occurred.

16 Claims, 6 Drawing Sheets

U.S. PATENT DOCUMENTS

2004/0183522 A1    9/2004    Gunn et al.

OTHER PUBLICATIONS

PCT Written Opinoin (PCT/US05/24686) mailed May 12, 2006 (10 pages).

Hewlett-Packard Company, "Traveling Wave Fault in Power Transmission Systems," Feb. 1977.

Extended European Search Report for corresponding European Application No. 05771389.3 mailed Apr. 29, 2010, 8 pages.

* cited by examiner

TRAVELING WAVE BASED RELAY PROTECTION

CROSS-REFERENCE TO RELATED APPLICATIONS

This application is a divisional application of and claims priority from U.S. patent application Ser. No. 10/891,449, filed on Jul. 15, 2004. The contents of the prior application are incorporated herein by reference.

TECHNICAL FIELD

This description relates to fault protection, and more particularly to traveling wave based relay protection.

BACKGROUND

Power transmission lines can carry alternating current (AC). When a fault occurs on a line, it is useful to rapidly determine the existence and location of the fault, so that protective measures can be taken before components connected to the line are damaged. The location of the fault also may be used in fixing the cause of the fault.

SUMMARY

In one general aspect, an apparatus includes at least one Rogowski coil and a processor. The at least one Rogowski coil is positioned within an electrical power distribution network to detect a first traveling wave current caused by a fault on an electrical power transmission line of the network, generate a first signal indicative of detection of the first traveling wave, detect a second traveling wave current caused by the fault on the transmission line, and generate a second signal indicative of detection of the second traveling wave. The processor is adapted to receive the first signal and the second signal and to determine, based on the first signal and the second signal, where on the transmission line the fault occurred.

Implementations may include one or more of the following features. For example, the apparatus can include a single Rogowski coil that generates the first and second signals, or a first Rogowski coil that generates the first signal and a second Rogowski coil that generates the second signal. The processor can be further operable to receive a timing synchronization signal. When a bus electrically connected to the transmission line, the second traveling wave current can be caused by the fault on the electrical power transmission line and can be reflected by the bus.

In another general aspect, an electrical protection apparatus includes a first Rogoi coil, a second Rogowski coil, and a protection device. The first Rogowski coil is positioned to detect a first traveling wave current on a first transmission line of a power distribution network and to generate a first signal indicative of a polarity of the first traveling wave caused by a fault within the network. The second Rogowski coil is positioned to detect a second traveling wave current on a second transmission line of the network and to generate a second signal indicative of a polarity of the second traveling wave caused by the fault within the network. The protection device is adapted to receive the first signal and the second signal and is operable to determine, based on the first signal and the second signal, where in the network the fault occurred.

Implementations may include one or more of the following features. For example, the protection device can include a relay and a processor. The apparatus can further include a circuit breaker operable to open in response to a signal from the protection device, where the signal is generated by the protection device upon the determination by the protection device of where the fault in the network occurred. The apparatus can further include a first circuit breaker positioned on the first transmission line and a second circuit breaker positioned on the first transmission line, where the protection device is further operable to cause the first circuit breaker, the second circuit breaker, or both circuit breakers to open in response to a determination by the protection device of where the fault in the network occurred. The apparatus can further include a busbar, to which the first transmission line and the second transmission line are electrically connected.

In another general aspect, determining the location of a fault on an electrical power transmission line includes receiving a first signal from a Rogowski coil positioned to detect a first traveling wave current caused by the fault, where the first signal is indicative of a time at which the first traveling wave is detected, receiving a second signal from a Rogowski coil positioned to detect a second traveling wave current caused by the fault, where the second signal is indicative of a time at which the second traveling wave is detected, and determining, based on the first signal and the second signal, where on the transmission line the fault occurred.

Implementations may include one or more of the following features. For example, the first signal and the second signal can be received from the same Rogowski coil, or the first signal can be received from a first Rogowski coil and the second signal can be received from a second Rogowski coil. A timing synchronization signal may be received, and, based on the timing synchronization signal, the first signal, and the second signal, a determination may be made as to where on the line the fault occurred.

The transmission line can include a bus electrically connected to the transmission line. At least one of the Rogowski coils can be adapted for detecting a traveling wave current caused by a fault on the electrical power transmission line that is reflected by the bus and can be adapted for generating a third timing signal indicative of a time at which the reflected traveling wave is detected.

In another general aspect, protecting a power apparatus from a fault in a power distribution network includes receiving a first signal from a first Rogowski coil positioned to detect a first traveling wave current on a first transmission line of the network, where the first signal is indicative of a polarity of the first traveling wave; and receiving a second signal from a second Rogowski coil positioned to detect a second traveling wave current on a second transmission line of the network, where the second signal is indicative of a polarity of the second traveling wave. The location of the fault in the network is determined based on the first signal and the second signal, and a current flow on a transmission line of the network is halted based on the determination of the fault location. The transmission line upon which the current flow is halted can be the first or second transmission line, or can be a transmission line in the network other than the first transmission line or the second transmission line. A first tracking pulse having a predetermined amplitude and width may be generated in response to a first detected traveling wave current that exceeds a predetermined threshold value, and a second tracking pulse having a predetermined amplitude and width can be generated in response to a second detected traveling wave current that exceeds a predetermined threshold value. Based on the first tracking pulse and the second tracking pulse, a determination may be made as to where the fault in the network occurred.

DESCRIPTION OF DRAWINGS

Like reference symbols in the various drawings indicate like elements.

DETAILED DESCRIPTION

A fault in a power system causes traveling waves (TWs) that propagate through the system away from the fault location at velocities close to the speed of light. The TWs reflect at points where the impedance of the system changes. TWs can totally reflect, or can partially reflect and partially refract, with the refracted portion continuing to travel in the same direction. TWs have a fast rising front and a slower decaying tail, and have magnitudes that decrease with time. When TWs are generated, then both traveling wave voltages (TWVs) and traveling wave currents (TWCs) exist. TWCs can be used for fast relay protection and accurate determination of fault locations in power systems.

The surge impedance $Z_s$ of a transmission line is given by $$Z_s = \sqrt{L/C}, \quad (1)$$

where L is the line inductance in Henries per unit length, and C is the line capacitance in Farads per unit length. Faults in power lines cause traveling waves that propagate along the line away from the fault. The velocity of a traveling wave, $C_{TW}$, is given by $$C_{TW} = 1/\sqrt{LC} \quad (2)$$

and is approximately equal to the speed of light for most transmission lines. The traveling wave emitted from a fault has a traveling wave voltage (TWV or $V_{TW}$) and a traveling wave current (TWC or $i_{TW}$). At the instant of the fault, the TWV and the TWC are related by $$V_{TW} = Z_s \times i_{TW}, \quad (3)$$

where $V_{TW}$ is the instantaneous voltage on the line, and $i_{TW}$ is the instantaneous current in the line.

After a traveling wave is emitted from the fault location, the wave propagates along the line until the wave reaches a point on the line where the impedance changes (e.g., a transformer or a bus). Because of the impedance change, the wave is reflected back along the line or is partially reflected and partially transmitted. The time at which individual reflections and transmissions occur on the line can be used to determine the location of the fault on the line.

Figure 1:
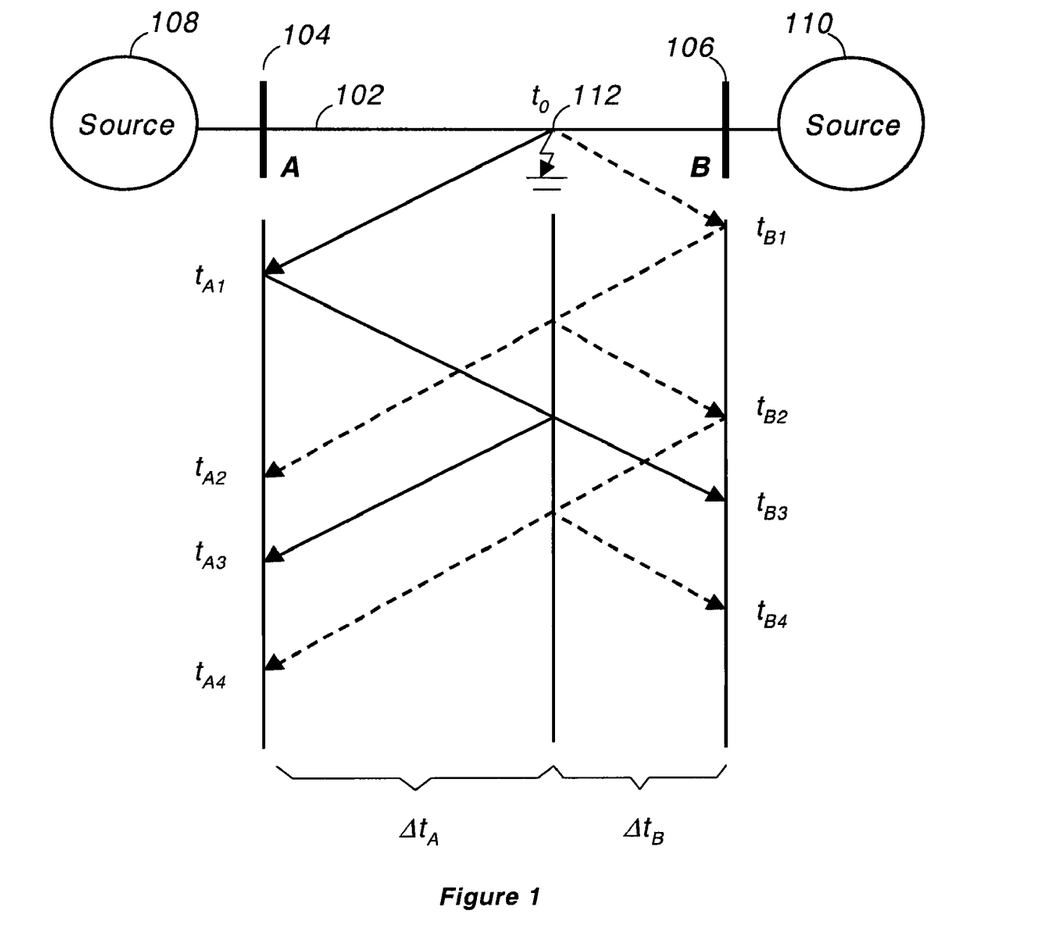
FIG. 1 is a diagram of the temporal relations between the generation of traveling waves on a transmission line at a fault location and reflections of the traveling waves at points of impedance changes on the line.

For example, as shown in FIG. 1, a transmission line 102 is connected to a first bus 104, to a second bus 106, and to two sources 108 and 110. When a fault occurs at a location 112 on the line, traveling waves propagate away from the fault location 112 on the line 102 towards the buses 104 and 106 at a speed given by equation (2). When a traveling wave reaches a point of changing impedance on the line 102 (e.g., a bus 104 or 106), the wave is either reflected or partially reflected and partially transmitted. The amplitude, $v_r$, of the reflected wave is $$v_r = \frac{Z_b - Z_s}{Z_b + Z_s} v_i, \quad (4)$$

where $v_i$ is the amplitude of the incident traveling wave, $Z_b$ is the impedance of the bus 104 or 106, and $Z_S$, as noted above, is the surge impedance. The amplitude, $v_t$, of the transmitted wave is $$v_t = \frac{2Z_b}{Z_b + Z_s} v_i. \quad (5)$$

When the impedance of the bus 104 or 106 is much smaller than the surge impedance ($Z_b \ll Z_s$), the reflected wave amplitude may be approximated as being equal to the incident wave amplitude ($|v_r|=|v_i|$), and the transmitted wave amplitude may be approximated as being zero ($v_t=0$).

Because the ionized fault resistance at fault location 112 is usually much less than the surge impedance Zs, the traveling wave that reflects off bus 104 is totally reflected at fault location 112 and travels back to bus 104, with a reversal of the polarity of the pulse. If the fault resistance has a higher value that is comparable to the value of the surge resistance, the TWC will not totally reflect at the fault location 112, and, instead, will also be partially transmitted through the fault location 112 toward the bus 106 with a reduced magnitude as given in equation (5). The energy of the first incoming traveling wave to arrive at bus 104 is significantly larger than the energy of the wave that arrives at bus 104 after being reflected from bus 106 and transmitted through fault location 112. This enables reliable differentiation between the reflected and transmitted waves. Similarly, the TWC that reflects off bus 106 will be partially reflected and partially transmitted by the ionized fault resistance at fault location 112.

The arrival times of the TWCs at buses 104 and 106 are shown in the lower portion of FIG. 1, where distance is measured on the horizontal axis and time is measured on the vertical axis. For example, the TWC emitted from fault location 112 at time $t=t_o$ in the direction of bus 104 (i.e., the first direct wave) travels at speed $C_{TW}=1/\sqrt{LC}$ over a distance A and arrives at bus 104 at time $t_{A1}=t_o+\Delta t_A$. The speed, distance, and time are related by $\Delta t_A = A\sqrt{LC}$. The first TWC that is reflected from bus 106 and transmitted through fault location 112 arrives at bus 104 at time $t_{A2}$, which is defined as:

$$t_{A2}=t_o+\Delta t_A+2\Delta t_B=t_o+(A+2B)\sqrt{LC},$$

where B is the distance from the fault location 112 to bus 106. The first TWC that is reflected from bus 104 and from fault location 112 arrives at bus 104 at time $t_{A3}$, which is defined as:

$$t_{A3}=t_o+3\Delta t_A=t_o+3A\sqrt{LC}.$$

The second TWC that is reflected from bus 106 and transmitted through fault location 112 arrives at bus 104 at time $t_{A4}$, which is defined as:

$$t_{A4}=t_o+\Delta t_A+4\Delta t_B=t_o+(A+4B)\sqrt{LC}.$$

The initial TWC emitted from fault location 112 arrives at bus 106 at time $t_{B1}$, which is defined as:

$$t_{B1} = t_o + \Delta t_B + 2\Delta t_B = t_o + B\sqrt{LC}.$$

The first TWC that is reflected from bus 106 and from fault location 112 arrives at bus 106 at time $t_{B2}$, which is defined as:

$$t_{B2} = t_o + 3t_B = t_o + 3B\sqrt{LC}.$$

The first TWC that is reflected from bus 104 and transmitted through fault location 112 arrives at bus 106 at time $t_{B3}$, which is defined as:

$$t_{B3} = t_o + 2\Delta t_A + \Delta t_3 = t_o + (2A+B)\sqrt{LC}.$$

The second TWC that is reflected from bus 106 and from fault location 112 arrives at bus 106 at time $t_{B4}$, which is defined as:

$$t_{B4} = t_o + 5\Delta t_B = t_o + 5B\sqrt{LC}.$$

Figure 2:
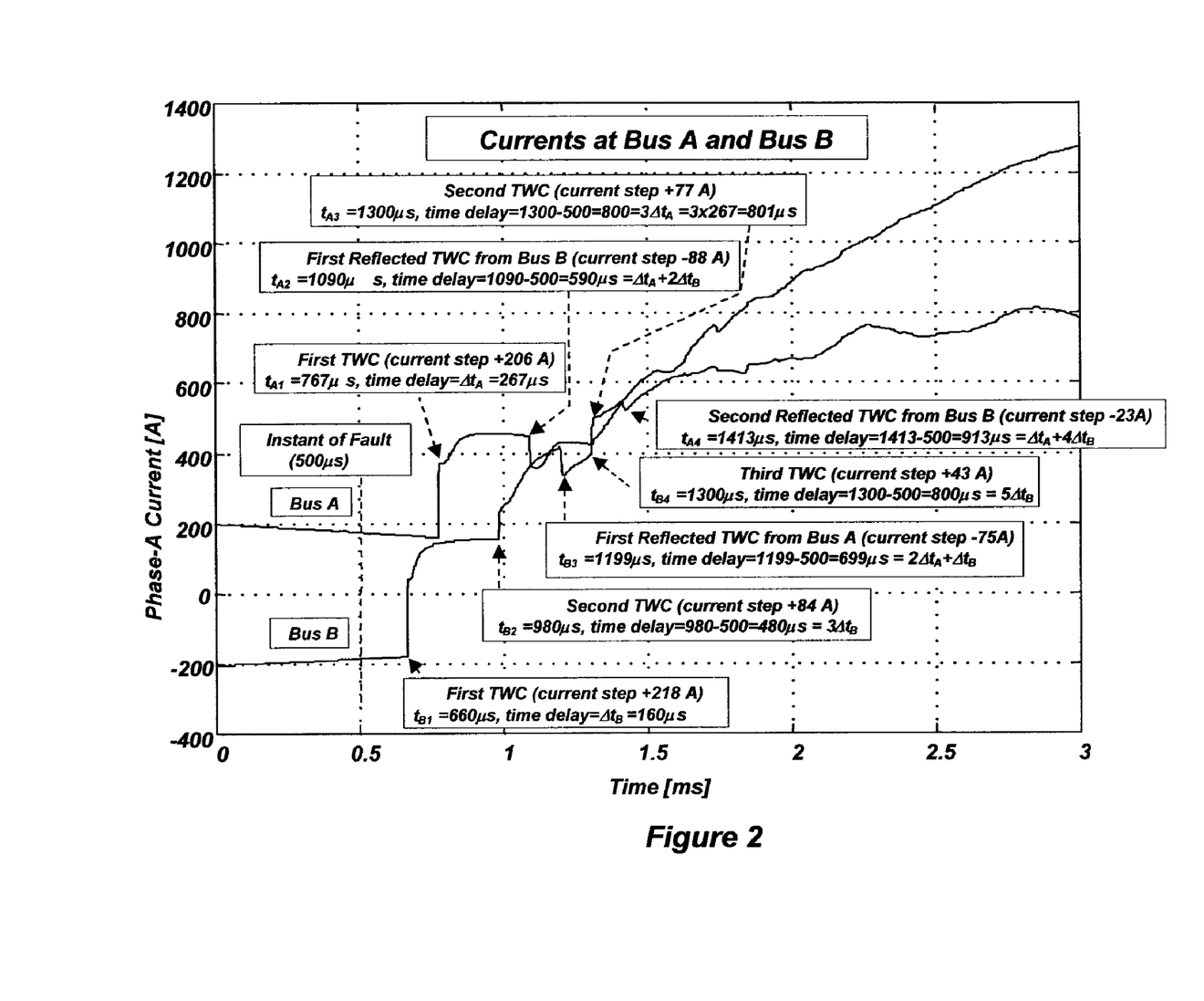
FIG. 2 is a graph of instantaneous current on a transmission line shortly before and shortly after a fault in the line occurs.

FIG. 2 shows current waveforms recorded at buses 104 and 106 due to a fault at location 112 on an 80-mile long transmission line 102 (as shown in FIG. 1). The arrival of TWCs at bus 104 (referred to as "Bus A" in FIG. 2) and bus 106 (referred to as "Bus B" in FIG. 2) is also evident in the current waveforms shown in FIG. 2. The fault simulated in FIG. 2 is a single-phase-to-ground fault in the A-phase of the AC transmission line that occurs at $t_o = 0.5$ ms at a distance of 50 miles from bus 104 near the voltage peak (at 500 μs, 79°) of an AC cycle. For simplicity, FIG. 2 shows only the currents measured on the A-phase line and omits representation of the currents on the B-phase line and the C-phase line.

The lower trace of FIG. 2 shows the current at bus 106. The first incoming TWC pulse reaches bus 106 at $t_{B1} = 660$ μs and produces an approximately 218 A positive step change in the line current. The first TWC pulse to be reflected by bus 106 and by fault location 112 reaches bus 106 at $t_{B2} = 980$ μs. The first TWC pulse that is reflected from bus 104 and transmitted through fault location 112 arrives at bus 106 at $t_{B3} = 1199$ μs and produces an approximately 75 A negative step change in the line current.

The third TWC pulse reflected from the fault location 112 reaches bus 106 at $t_{B4} = 1300$ μs and produces an approximately 43 A positive step change in the line current.

The upper trace of FIG. 2 shows the current at bus 104. The first incoming TWC pulse reaches bus 104 at $t_{A1} = 767$ μs, and produces an approximately 206 A positive step change in the line current. The first TWC pulse to be reflected by bus 106 and transmitted through fault location 112 reaches bus 104 at $t_{A2} = 1090$ μs and produces an approximately 88 A negative step change in line current. The second TWC pulse to arrive at bus 104 after being reflected from bus 104 and reflected by the fault location 112 produces an approximately 77 A positive step change in line current and reaches bus 104 at $t_{A3} = 1300$ μs. The second TWC pulse to be reflected by bus 106 and transmitted through fault location 112 reaches bus 106 at $t_{A4} = 1413$ μs and produces an approximately 23 A negative step change in line current.

The fault location 112 on the line 102 can be determined by measuring the time difference between the time at which the initial pulse is received at bus 104 and the time at which the second pulse, which is reflected from the bus 104 and then from the fault, is received at bus 104. The distance, D, from the bus 104 to the fault location 112 is given by:

$$D = \frac{c_{TW} \times (t_{A3} - t_{A1})}{2}. \tag{6}$$

In the similar way, the fault location 112 on the line 102 can be determined by measuring the time difference between the time at which the initial pulse is received at bus 106 and the time at which the second pulse, which is reflected from the bus 106 and then from the fault, is received at bus 106. The distance, D, from the bus 106 to the fault location 112 is given by:

$$D = \frac{c_{TW} \times (t_{B2} - t_{B1})}{2}. \tag{7}$$

The fault location can also be determined using synchronized measurements of the arrival times of pulses that reach buses 104 and 106 at the two ends of the transmission line 102. The times can be synchronized by a GPS reference time signal available at each bus. Using arrival times of pulses at the two ends of the line 102, the distance, D, from the bus 104 to the fault location 112 is given by $$D = \frac{l - c_{TW} \times (t_{A1} - t_{B1})}{2}, \tag{8}$$

where l is the line length.

To reliably detect and time tag the arrival of a traveling wave, the TWC pulse must be filtered out from the current component corresponding to the fundamental power frequency (e.g., 60 Hz). The arrival of a TWC at a location on the line 102 (e.g., at bus 104 or 106) can be detected by a coil positioned on the transmission line 102 just before the bus 104 or 106. The coil can be, for example, a Rogowski coil. Generally speaking, a Rogowski coil includes a conductive element that is wound around a non-magnetic core. The conductive element may be, for example, a metal wire or a metal deposit. The non-magnetic core may be made of any material that has a magnetic permeability that is substantially equal to the permeability of free space, such as, for example, an air core or a printed circuit board (PCB) on which the conductive element is traced.

The output voltage of a Rogowski coil is proportional to the rate of change of measured current (di/dt) enclosed by the coil. Thus, Rogowski coils are particularly sensitive to high-frequency components, and are able to amplify high-frequency signal components without using special filters. This unique feature of Rogowski coils makes them particularly suitable for measuring rapid current changes and for detecting TWCs.

Figure 3:
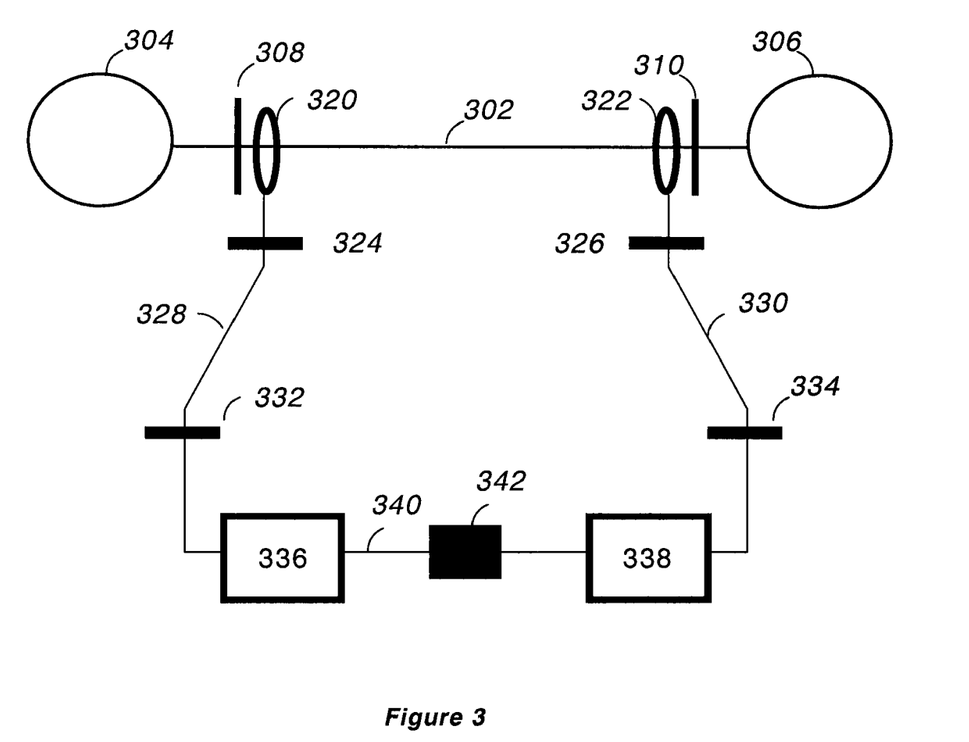
FIG. 3 is a schematic view of a transmission line and two Rogowski coils used to measure current changes on the line.

As shown in FIG. 3, a transmission line 302 is connected to power sources 304 and 306 and to buses 308 and 310. Rogowski coils 320 and 322 are located on the transmission line 302 in close proximity to the buses 308 and 310, respectively. The coils 320 and 322 can be constructed according to various techniques. Examples of such techniques are discussed in, for example, U.S. Pat. No. 6,313,623, titled "High Precision Rogowski Coil," and U.S. Pat. No. 6,680,608, titled "Measuring Current Through An Electrical Conductor," both of which are incorporated by reference. For example, the coils 320 and 322 can include two or more arms that form a main loop (or loops) of the coils 320 and 322 when coupled together. Various winding techniques for winding the conductive element may be used in constructing the coils 320 and 322, and the coils 320 and 322 can include multiple coils that are associated with one another in various ways. These and other construction details related to the coils 320 and 322 may be selected so as to ensure high levels of sensitivity and accuracy in determining the current changes on the transmission line 302.

The output signal from the Rogowski coils 320 and 322, which can be located at a high voltage potential near the transmission line 302, can be passed to electrical-to-optical converters 324 and 326, respectively, and then transmitted by optical fibers 328 and 330 to optical-to-electrical converters 332 and 334, respectively, which can be located close to electrical ground. Once the Rogowski coil signals have been re-converted to electrical signals, they can be further processed by processors 336 and 338. Processors 336 and 338 can communicate with each other through a data transmission line 340 to compare the signals that they receive and generate.

Although the communications line 340 may communicate information between the processors 333 and 338, there may nonetheless be some amount of delay in transmitting the various signals. When comparing current signals from the coils 308 and 310, relative timing information for the current signals may be required in order to account for this delay (as well as other delays that may occur) so as to make a meaningful comparison of the current signals.

Such timing information can be obtained from various sources. For example, an external synchronizing network 342 (e.g., a network that provides a GPS clock) may be set up to provide timing information. Processors 336 and 338 can receive timing information from the synchronizing network, so that the arrival times of TWCs at Rogowski coils 320 and 322 can be compared to an absolute reference standard. As another example, the processors 336 and 338 may time stamp their respective current measurements before transmission of the measurements.

Figure 4:
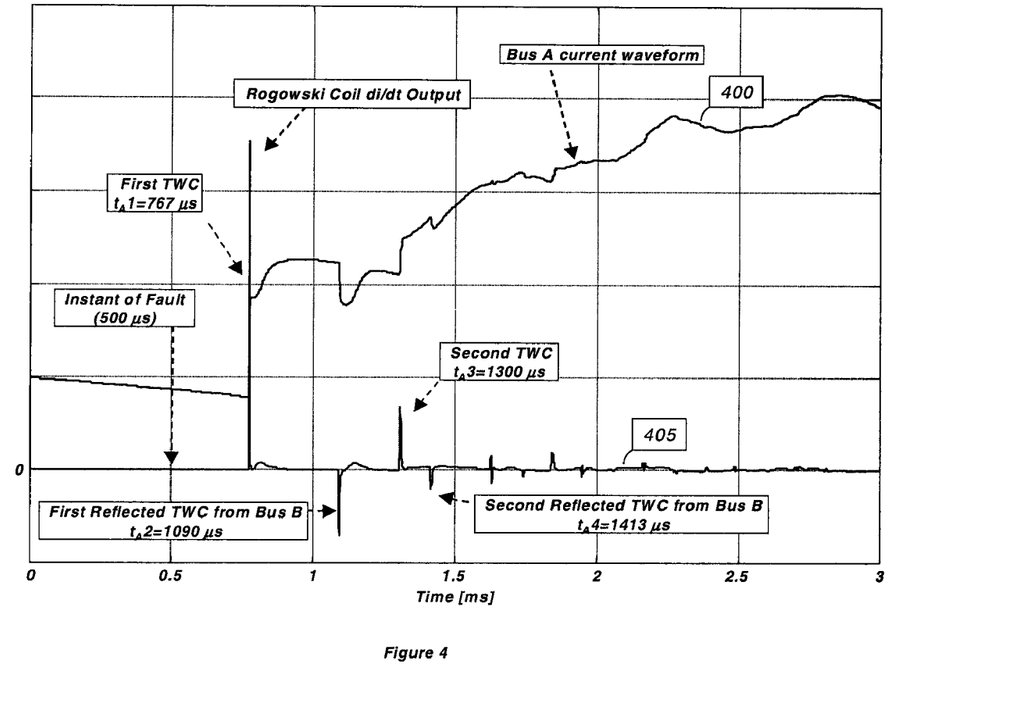
FIGS. 4 and 5 are graphs of the instantaneous current and the instantaneous change in current on a transmission line on opposite sides of a fault in the line shortly before and shortly after the fault occurs.
Figure 5:
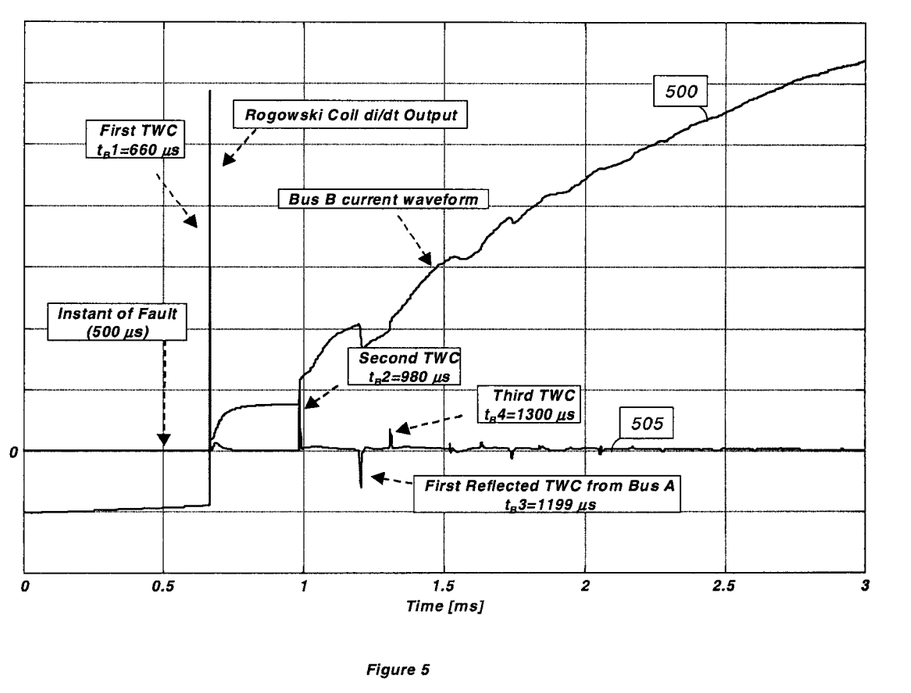

FIG. 4 shows an instantaneous current measurement 400 at a bus 308 at one end of an 80-mile long transmission line 302 along with the change in current 405 measured by the Rogowski coil 320 located close to the bus 308. FIG. 5 shows the instantaneous current measurement 500 at a bus 310 at the other end of the transmission line 302 and the change in current measured by the Rogowski coil 322 located close to the bus 310. When a fault occurs at a time t=500 μs, high-frequency transients are superimposed on the 60 Hz fundamental frequency in the current traces. The Rogowski coils 320 and 322 detect the changes in current and register signals that are proportional to the temporal derivative of the current. When the output signal of a Rogowski coil 320 or 322 exceeds a threshold value, processor 336 or 338, respectively, generates a standard amplitude and width tracking pulse that can be used by timing logic within the processor 336 or 338 to determine the location of the fault on the transmission line according to equations (6) (7), or (8).

To achieve reliable fault detection, an instantaneous current level detector (ICLD), which can be implemented in hardware or software, provides a supervisory function by monitoring the instantaneous value of the current. Whenever a TWC having an amplitude within predetermined threshold values is detected by a processor 336 or 338, the processor generates a standard amplitude and width tracking pulse. A relay that is operated in response to the detection of a TWC will not issue a trip command until the ICLD asserts and latches.

As discussed above, Rogowski coils may be used as the current sensing coils of FIGS. 3-5. Rogowski coils are very sensitive to even low-level current changes, and, thus, are capable of, for example, detecting and initiating clearing of sustained arcing fault currents. Such fault currents generally are at a small fraction of the maximum available fault current, and are not much higher than the load currents themselves.

The ability to detect small current changes means that fault detection levels may be set relatively low, thereby reducing stress on (or damage to) equipment and speeding fault response times without sacrificing reliability. Moreover, a risk of fire propagation is reduced, and faster response times (including a faster restoration of service) may be provided.

Rogowski coils do not saturate, and, therefore, are capable of handling large currents and avoiding false tripping of circuit breakers in response to faults outside the protected zone. The ability of a particular Rogowski coil to avoid saturation may allow a single Rogowski coil to provide current measurements over a wide measurement range, such as, for example, from several amps to several hundred thousand amps. As a result, such coils may be used to measure currents having a large DC component. Also, Rogowski coils may operate over a wide frequency range, such as, for example, from approximately 0.1 Hz to over 1 MHz. Rogowski coils also may be designed to provide a bandpass frequency response of up to approximately 200 MHz or more. Additionally, Rogowski coils are generally immune to external magnetic fields, and, therefore, may avoid any effects of such fields on current measurements. Moreover, Rogowski coils are relatively inexpensive and typically do not require substantial space or wiring. Finally, a Rogowski coil is easily installed by, for example, simply placing the relevant conductor through the coil (or by placing the coil around the conductor).

Because Rogowski coils are sensitive to changes in current, they can be used to detect a fault in less than one full 60 Hz cycle (i.e., 16.67 ms). As is evident from the example described above, because TWCs produced by a fault 112 propagate on the transmission line 102 at close to the speed of light, and Rogowski coils can detect a TWC with sub-millisecond accuracy, a Rogowski coil can detect a TWC indicating a fault in far less time than the time period of a 60 Hz cycle (i.e., 16.67 ms). Thus, one or more Rogowski coils can quickly identify a fault in a power transmission system and respond to the fault to protect the system (as explained in further detail below).

Figure 6:
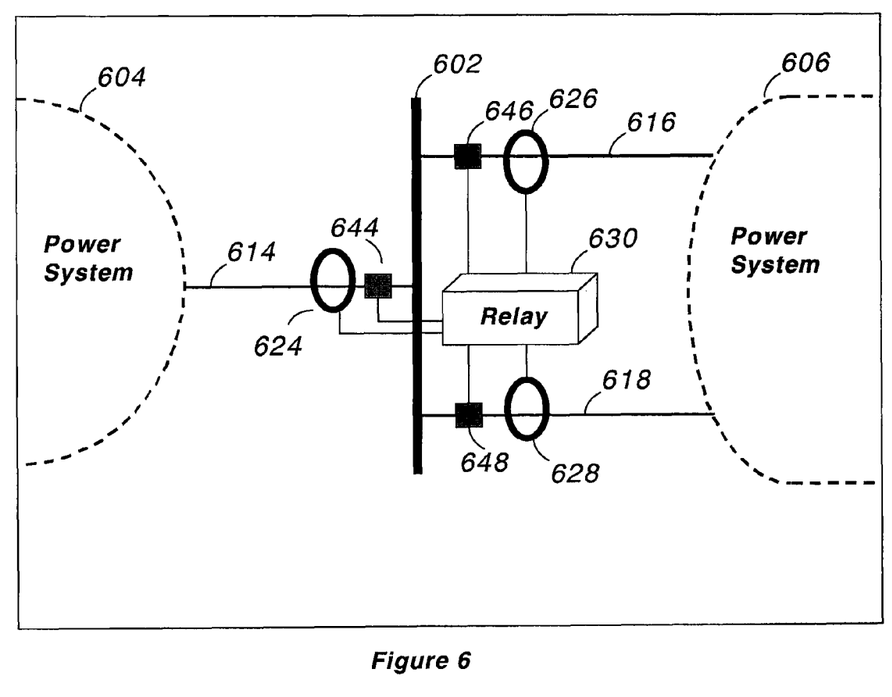
FIG. 6 is a schematic diagram of a power network protection system.

A differential busbar protection system using Rogowski coils is illustrated with reference to FIG. 6. As shown, an electrical power system includes a busbar 602 electrically connected to a first power system 604 (e.g., a source or a load) by a first transmission line 614 and to a second power system 606 (e.g., a source or a load) by a second transmission line 616 and a third transmission line 618. Thus, current can flow into the busbar 602 on line 614 and out of busbar 602 on lines 616 and 618. During normal operation, the sum of currents flowing into the busbar 602 is equal to the sum of currents flowing out of the busbar 602.

Rogowski coils 624, 626, and 628 are located close to busbar 602 and sense current and current changes in lines 614, 616, and 618, respectively. A relay 630 electrically connected to the Rogowski coils 624, 626, and 628 and to circuit breakers 644, 646, and 648 located on respective lines 614, 616, and 618 serves to provide integrated protection against short circuits and other system malfunctions and/or failures, as described in more detail below. As such, the relay 630 may be programmed or otherwise associated with a predetermined algorithm for automatically implementing the integrated protection scheme. For example, the relay 630 can include an ICLD to monitor the instantaneous level of the current and to generate a standard amplitude and width tracking pulse whenever a TWC having an amplitude within predetermined threshold values is detected by Rogowski coils 624, 626, and 628. The tracking pulses can be used to make logical decisions for protecting the network (as explained in more detail below). Although only one relay 630 is shown, two or more relays in communication with each other can be used in the system. For example, a separate relay can be associated with an individual Rogowski coil 624, 626, or 628.

With regard to the protection system 600, the relay 630 is capable of providing multiple types of protection against electrical or mechanical malfunctions and failures, and of integrating these types of protection into a cohesive protection scheme. Moreover, the relay 630 is capable of interacting with other relays and/or other coils in order to provide further options for constructing an integrated electrical protection system.

One type of protection afforded by the relay 630 is differential protection. In a differential protection scheme, the relay 630 operates to compare the currents on lines 614, 616, and 618 to check if the currents have some predetermined relationship to one another. As one example, when a fault occurs at busbar 602 or otherwise between coils 624, 626, and 628, a transient current pulse is created on each of the lines 614, 616, and 618. Because the fault occurs within the zone between coils 624, 626, and 628, the transient pulses on each of the lines has the same polarity. In such a case, the relay 630 can determine that the fault is located within the zone and can trip each circuit breaker 644, 646, and 648 to protect the busbar 602 from overload due to power supplied from power system 604 or 606.

As another example, when a fault occurs outside the busbar 602, such as, for example, on transmission line 616, the polarity of the transient pulse moving toward the busbar 602 (e.g., on line 616) will be opposite to the polarity of the transient pulse moving away from the busbar 602 (e.g., on lines 614 and 618). In such a case, the relay 630 can determine that the fault is located on line 616 because the polarity of the pulse detected by Rogowski coil 626 is different from the polarity of the pulses detected by coils 624 and 628. Thus, relay 630 can trip circuit breaker 646 to protect the busbar 602 from the fault on line 616 but can allow power to continue to flow to/from power system 604 to busbar 602 on line 614 and to/from power system 606 on line 618. Similarly, when a fault occurs on line 618, relay 630 can determine that the polarity of the pulse measured by coil 628 is different from the polarity measured by coils 624 and 626 and, in response, can trip circuit breaker 648 while leaving breakers 644 and 646 closed.

As a further example, when a fault occurs upstream of coil 624, the polarity of the pulse measured by coil 624 is different from the polarity measured by coils 626 and 628. Based on this information, relay 630 can determine the location of the fault but need not trip any of the circuit breakers.

The relay 630 may be, for example, a microprocessor-controlled, multi-function relay, such as a three-phase relay having multiple voltage and/or current inputs. As discussed above, the relay 630 may be in communication with circuit breakers 644, 646, and 648, companion relays (not shown), control equipment (not shown), and other circuit elements. For example, the relay 630 may be connected to a network switch/hub that supports having the relay 630 communicate with other relays in implementing an electrical protection system.

Using these and related techniques, electrical equipment may be protected from damage due to fault currents. Moreover, by placing the coils 624, 626, and 628 around selected pieces of circuitry/equipment, and thereby establishing the protection zones, a location as well as an existence of a fault current may be accurately detected. Additionally, a number of current sensors (coils) and relays may be minimized (relative to other electrical protection systems) so as to increase an ease of installation.

A number of implementations have been described. Nevertheless, it will be understood that various modifications may be made. Accordingly, other implementations are within the scope of the following claims.

What is claimed is:

1. A method of protecting a power apparatus from a fault in an AC electrical power network that operates at a fundamental power frequency, the method comprising:
   receiving a first signal from a first Rogowski coil positioned to filter a first traveling wave current on a first transmission line of the AC electrical power network from a current component corresponding to the fundamental power frequency, wherein the first signal is indicative of a polarity of the first traveling wave;
   receiving a second signal from a second Rogowski coil positioned to filter a second traveling wave current on a second transmission line of the network from a current component corresponding to the fundamental power frequency, wherein the second signal is indicative of a polarity of the second traveling wave;
   determining, based on the first signal and the second signal, the location of the fault in the network;
   halting a current flow on a transmission line of the network based on the determination of the fault location;
   generating a first tracking pulse having a predetermined amplitude and width in response to a first detected traveling wave current that exceeds a first predetermined threshold value; and
   generating a second tracking pulse having a predetermined amplitude and width in response to a second detected traveling wave current that exceeds a second predetermined threshold value.

2. The method of claim 1, wherein the transmission line upon which the current flow is halted is the first transmission line.

3. The method of claim 1, wherein the transmission line upon which the current flow is halted is a transmission line in the network other than the first transmission line or the second transmission line.

4. The method of claim 1, further comprising determining, based on the first tracking pulse and the second tracking pulse, where the fault in the network occurred.

5. The method of claim 1, wherein the first predetermined threshold value and the second predetermined threshold value are the same threshold.

6. An electrical protection apparatus comprising:
   a first Rogowski coil that filters a first traveling wave current on a first transmission line of an AC electrical power network from a current component corresponding to the fundamental power frequency and that generates a first signal indicative of a polarity of the first traveling wave caused by a fault within the network;
   a second Rogowski coil that filters a second traveling wave current on a second transmission line of the network from the current component corresponding to the fundamental power frequency and that generates a second signal indicative of a polarity of the second traveling wave caused by the fault within the network; and
   a protection device adapted to receive the first signal and the second signal and operable to:
   determine, based on the first signal and the second signal, where in the network the fault occurred, halt a current flow on a transmission line of the network based on the determination of where in the network the fault occurred, generate a first tracking pulse having a predetermined amplitude and width in response to a first detected traveling wave current that exceeds a first predetermined threshold value, and generate a second tracking pulse having a predetermined amplitude and width in response to a second detected traveling wave current that exceeds a second predetermined threshold value.

7. The apparatus of claim 6, wherein the protection device comprises a relay.

8. The apparatus of claim 6, wherein the protection device comprises a processor.

9. The apparatus of claim 6, further comprising a circuit breaker operable to open in response to a signal from the protection device, the signal being generated by the protection device upon the determination by the protection device of where the fault in the network occurred.

10. The apparatus of claim 6, further comprising:
a first circuit breaker positioned on the first transmission line; and
a second circuit breaker positioned on the second transmission line,
wherein the protection device is further operable to cause the first circuit breaker, the second circuit breaker, or both circuit breakers to open in response to a determination by the protection device of where the fault in the network occurred.

11. The apparatus of claim 10, further comprising a busbar, wherein the first transmission line and the second transmission line are electrically connected to the busbar.

12. A method of protecting a power apparatus from a fault in a power network, the method comprising:

receiving a first signal from a first Rogowski coil positioned to detect a first traveling wave current on a first transmission line of the network, wherein the first signal is indicative of a polarity of the first traveling wave;

receiving a second signal from a second Rogowski coil positioned to detect a second traveling wave current on a second transmission line of the network, wherein the second signal is indicative of a polarity of the second traveling wave;

determining, based on the first signal and the second signal, the location of the fault in the network;

halting a current flow on a transmission line of the network based on the determination of the fault location;

generating a first tracking pulse having a predetermined amplitude and width in response to a first detected traveling wave current that exceeds a first predetermined threshold value; and generating a second tracking pulse having a predetermined amplitude and width in response to a second detected traveling wave current that exceeds a second predetermined threshold value.

13. The method of claim 12, wherein the first predetermined threshold value and the second predetermined threshold value are the same threshold.

14. The method of claim 12, wherein the transmission line upon which the current flow is halted is the first transmission line.

15. The method of claim 12, wherein the transmission line upon which the current flow is halted is a transmission line in the network other than the first transmission line or the second transmission line.

16. The method of claim 12, further comprising determining, based on the first tracking pulse and the second tracking pulse, where the fault in the network occurred.

* * * * *